US010724150B2

(12) United States Patent
Kajiwara et al.

(10) Patent No.: US 10,724,150 B2
(45) Date of Patent: Jul. 28, 2020

(54) METHOD OF MANUFACTURING SILICON SINGLE CRYSTAL (71) Applicant: SUMCO CORPORATION, Tokyo (JP)

(72) Inventors: Kaoru Kajiwara, Tokyo (JP); Ryota Suewaka, Tokyo (JP); Hideki Tanaka, Tokyo (JP); Takahiro Kanehara, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 151 days.

(21) Appl. No.: 15/773,323

(22) PCT Filed: Nov. 1, 2016

(86) PCT No.: PCT/JP2016/082376
§ 371 (c)(1),
(2) Date: May 3, 2018

(87) PCT Pub. No.: WO2017/082112
PCT Pub. Date: May 18, 2017

(65) Prior Publication Data
US 2018/0320288 A1 Nov. 8, 2018

(30) Foreign Application Priority Data

Nov. 13, 2015 (JP) ................................. 2015-223287

(51) Int. Cl.
C30B 15/14 (2006.01)
C30B 29/06 (2006.01)
C30B 15/10 (2006.01)

(52) U.S. Cl.
CPC .............. C30B 15/14 (2013.01); C30B 15/10 (2013.01); C30B 29/06 (2013.01)

(58) Field of Classification Search
CPC ......... C30B 15/14; C30B 15/20; C30B 15/10; C30B 29/06
See application file for complete search history.

(56) References Cited

U.S. PATENT DOCUMENTS 5,474,020 A   12/1995  Bell et al.
5,938,842 A *  8/1999  Sakurada ................ C30B 15/14
                                                        117/217

(Continued)

FOREIGN PATENT DOCUMENTS

CN    200974872 Y    11/2007
CN    101724899 A     6/2010
(Continued)

OTHER PUBLICATIONS

Office Action issued in Republic of Korea family member Patent Appl. No. 10-2018-7011746, dated Apr. 15, 2019.
(Continued)

Primary Examiner — Robert M Kunemund
(74) Attorney, Agent, or Firm — Greenblum & Bernstein, P.L.C.

(57) ABSTRACT

A method of manufacturing a single crystal is provided with a raw material melting step of heating a silicon raw material in a quartz crucible using a carbon heater to generate a silicon melt; and a crystal pull-up step of pulling up a single crystal from the silicon melt generated by the raw material melting step, wherein the silicon raw material is heated with the maximum surface temperature of a first part of the heater that is positioned above at least the upper end of the quartz crucible maintained below 1500° C. in the raw material melting step.

7 Claims, 7 Drawing Sheets

(56) References Cited

U.S. PATENT DOCUMENTS

| | | | |
|---|---|---|---|
| 9,932,692 B2* | 4/2018 | Sudo | .................... C03B 19/095 |
| 2004/0192015 A1 | 9/2004 | Ammon et al. | |
| 2007/0215038 A1 | 9/2007 | Iida et al. | |
| 2011/0139064 A1 | 6/2011 | Kato et al. | |
| 2011/0214604 A1* | 9/2011 | Takano | ................... C30B 15/14 |
| | | | 117/13 |
| 2011/0259260 A1* | 10/2011 | Takanashi | ............... C30B 15/20 |
| | | | 117/15 |
| 2018/0187330 A1 | 7/2018 | Kajiwara et al. | |

FOREIGN PATENT DOCUMENTS

| | | |
|---|---|---|
| JP | 58-172292 A | 10/1983 |
| JP | H02-221184 A | 9/1990 |
| JP | 5-294782 A | 11/1993 |
| JP | H06-227890 A | 8/1994 |
| JP | 2009-286650 A | 12/2009 |
| JP | 2010-018506 A | 1/2010 |
| JP | 2011-121827 A | 6/2011 |
| JP | 2012-201564 A | 10/2012 |
| JP | 2013-237586 A | 11/2013 |
| KR | 2007-0001203 A | 1/2007 |
| KR | 2010-0099987 A | 9/2010 |
| WO | 2003/029533 A1 | 4/2003 |
| WO | WO 22015/001593 * | 1/2015 |

OTHER PUBLICATIONS

International Search Report issued in International Patent Application No. PCT/JP2016/082376, dated Feb. 7, 2017.

Office Action issued in Taiwan family member Patent Appl. No. 105136096, dated Jun. 12, 2018.

* cited by examiner

METHOD OF MANUFACTURING SILICON SINGLE CRYSTAL

TECHNICAL FIELD

The present invention relates to a method of manufacturing a silicon single crystal by the Czochralski method (hereinafter, referred to as the CZ method) and, particularly to a method of heating a silicon raw material in a raw material melting step for generating a silicon melt.

BACKGROUND ART

Many silicon single crystals as substrate materials for semiconductor devices are manufactured by the CZ method. In the CZ method, a raw material such as polycrystalline silicon is charged into a quartz crucible and heated in a chamber for melting. Then, a seed crystal attached to the lower end of a pull-up shaft is lowered from above the quartz crucible and is dipped into the silicon melt. Then, the seed crystal is gradually lifted while rotating the seed crystal and the crucible, whereby a large single crystal grows at the lower end of the seed crystal.

A multi-pulling method is also known as a manufacturing method for a silicon single crystal according to the CZ method (see, e.g., Patent Document 1). In the multi-pulling method, after the pulling of the silicon single crystal is completed, additional silicon raw material is supplied to the same quartz crucible and is melted, and a subsequent silicon single crystal is pulled up from the obtained silicon melt. Such a raw material supplying step and a single crystal pull-up step are repeated to manufacture a plurality of single silicon crystals in one quartz crucible. According to the multi-pulling method, cost of the quartz crucible per silicon single crystal can be reduced. Further, the frequency of disassembling the chamber and exchanging the quartz crucible can be reduced, thus allowing improvement of operation efficiency.

There are known various methods of heating the silicon raw material. For example, in the method described in Patent Document 2, after a raw material is melted by upper and lower heaters disposed outside a crucible, power supply to the lower heater is immediately reduced to zero to form a solid layer of the raw material, and a silicon single crystal is grown from a melt layer coexisting on the solid layer. Further, in the method disclosed in Patent Document 3, a division heater constituted of a side heater for heating the periphery of a crucible and a bottom heater for heating the bottom portion of the crucible is used to melt a raw material in the crucible in a short time. Further, in the method disclosed in Patent Document 4, in order to suppress power consumption for melting a silicon material, a heater output is suppressed to a low level until the temperature of the silicon raw material exceeds a reference temperature ranging from 200° C. to 300° C., and the heater output is increased after the temperature of the silicon raw material exceeds the reference temperature.

A reduction in carbon concentration in a silicon single crystal is one of important issues. Because, it is known that carbon in the silicon single crystal accelerates oxygen precipitation, and an oxygen precipitate has influence on device performance (e.g., increases current leakage). For example, it is reported that when carrier lifetime is controlled by electron beam irradiation and annealing in an IGBT (Insulated Gate Bipolar Transistor), carbon may affect device characteristics such as saturation voltage.

An increase in carbon concentration in the silicon single crystal is considered to be brought about by CO gas mainly generated from a carbon heater. The CO gas is generated when SiO gas evaporated from a silicon melt reacts with high-temperature heater, and the generated CO gas adheres to an unmelted silicon raw material. Then, carbon is dissolved in the silicon raw material being melted, with the result that the carbon concentration in the melt is increased, which in turn increases the carbon concentration in a silicon single crystal pulled up from the silicon melt. Particularly, in the above-described multi-pulling method, the problem of carbon contamination becomes prominent since the carbon concentration in the single crystal increases as the number of times of pulling up the single crystal increases.

In order to pull up a silicon single crystal having a low carbon concentration, Patent Document 5 proposes a method in which a rectification member for increasing the flow rate of inert gas is provided at the upper portion of a carbon susceptor that retains a quartz crucible. The increase in the flow rate of the inert gas by the rectification member allows CO gas generated from a heater to be discharged efficiently.

CITATION LIST

Patent Document

[Patent Document 1] Japanese Patent Application Laid-Open No. 2010-018506
[Patent Document 2] Japanese Patent Application Laid-Open No. H06-227890
[Patent Document 3] Japanese Patent Application Laid-Open No. H02-221184
[Patent Document 4] Japanese Patent Application Laid-Open No. 2013-237586
[Patent Document 5] Japanese Patent Application Laid-Open No. 2012-201564

SUMMARY OF THE INVENTION

Problems to be Solved by the Invention

However, in the method described in Patent Document 5, the height of the susceptor is increased by existence of the rectification member, so that, in actuality, the rectification member is highly likely to collide with a structure in the chamber when the quartz crucible is lifted up. That is, during control for lifting the quartz crucible so as to maintain the liquid surface level constant when a silicon melt in the quartz crucible is reduced in the course of pulling up the single crystal, the rectification member attached to the susceptor being lifted together with the quartz crucible interferes with the structure in the chamber, making it impossible to lift the quartz crucible.

The present invention has been made to solve the above problem, and the object of the present invention is to provide a method of manufacturing a silicon single crystal capable of manufacturing a silicon single crystal having a low carbon concentration.

Means for Solving the Problems

To solve the above problems, a single crystal manufacturing method according to the present invention includes: a raw material melting step of heating a silicon raw material in a quartz crucible using a carbon heater to generate a silicon melt and a crystal pull-up step of pulling up a single crystal from the silicon melt generated by the raw material melting step. In the raw material melting step, the silicon raw material is heated with the maximum surface temperature of a first part of the heater that is positioned above at least the upper end of the quartz crucible maintained below 1500° C.

According to the present invention, it is possible to suppress CO gas from being generated from the first part of the heater that is positioned above the upper end of the quartz crucible, thereby making it possible to suppress the CO gas from being dissolved in the silicon raw material in the quartz crucible. This allows a silicon single crystal having a low carbon concentration to be manufactured.

In the present invention, in the raw material melting step, the silicon raw material is preferably heated with the maximum surface temperature of a second part of the heater that is positioned below the upper end of the quartz crucible increased to 1500° C. or higher. By increasing the maximum surface temperature of the second part of the heater, the silicon raw material in the quartz crucible can be sufficiently heated for melting. When the maximum surface temperature of the second part of the heater is set to 1500° C. or higher, particularly, when the surface temperature of the entire second part is set to 1500° C. or higher, generation of the CO gas from the heater is increased; however, the CO gas is generated below the quartz crucible, so that it hardly enters the quartz crucible. Thus, even when the maximum surface temperature of the second part of the heater is increased to 1500° C. or higher, or when the surface temperature of the entire second part is increased to 1500° C. or higher, a silicon single crystal having a low carbon concentration can be manufactured.

In the present invention, it is preferable that the heater includes an upper heater and a lower heater dividedly arranged in the vertical direction, the upper heater includes the upper part, and the lower heater includes the second part. In this case, it is preferable that the upper end of the upper heater is positioned above the upper end of the quartz crucible and that the upper end of the lower heater is positioned below the upper end of the quartz crucible. With this configuration, suppression of dissolution of the CO gas in the silicon raw material and melting of the raw material can be easily and reliably carried out by using the upper and lower heaters dividedly arranged in the vertical direction.

In the raw material melting step of the present invention, the upper end of the quartz crucible is preferably disposed between the upper and lower ends of the upper heater so as to be closer to the lower end than to the upper end. When the output of the upper heater is suppressed to make heating for the lower portion of the quartz crucible dominant, the temperature of the bottom portion of the quartz crucible is raised to increase a heat load applied to the quartz crucible, accelerating roughening or erosion of the crucible surface, which may increase dislocation of the silicon single crystal. However, by disposing the quartz crucible such that the upper end of the quartz crucible is positioned above the lower end of the upper heater, it is possible to suppress an increase in temperature of the bottom portion of the crucible, thus making it possible to suppress dislocation of the single crystal.

In the raw material melting step of the present invention, it is preferable that inert gas is introduced into a chamber housing the quartz crucible and the heater from above the quartz crucible, and that the inert gas in the chamber is exhaust from below the quartz crucible. When the maximum surface temperature of the second part of the heater is increased to 1500° C. or higher, generation of the CO gas from the second part of the heater is increased; however, the CO gas hardly enters the quartz crucible due to influence of the inert gas flowing in the furnace. Thus, even when the maximum surface temperature of the second part of the heater is increased to 1500° C. or higher, a silicon single crystal having a low carbon concentration can be manufactured.

The present invention provides a method of manufacturing a silicon single crystal by using a multi-pulling method in which a plurality of silicon single crystals are manufactured using a single quartz crucible through alternate repetition of the raw material melting step and the crystal pull-up step, wherein the silicon raw material is preferably heated in each of the plurality of raw material melting steps with the maximum surface temperature of the first part of the heater maintained below 1500° C. In the multi-pulling method, the problem of carbon contamination becomes prominent since carbon concentration in the single crystal increases as the number of times of pulling up the single crystal increases. However, the maximum surface temperature of the first part of the heater during the raw material melting step is maintained below 1500° C., thereby suppressing carbon contamination. Thus, effects advantageous for the multi-pulling method can be obtained.

Advantages of the Invention

According to the present invention, it is possible to provide a method of manufacturing a silicon single crystal capable of manufacturing a silicon single crystal having a low carbon concentration.

DETAILED DESCRIPTION OF THE EMBODIMENTS

Preferred embodiments of the present invention will be described in detail below with reference to the accompanying drawings.

Figure 1:
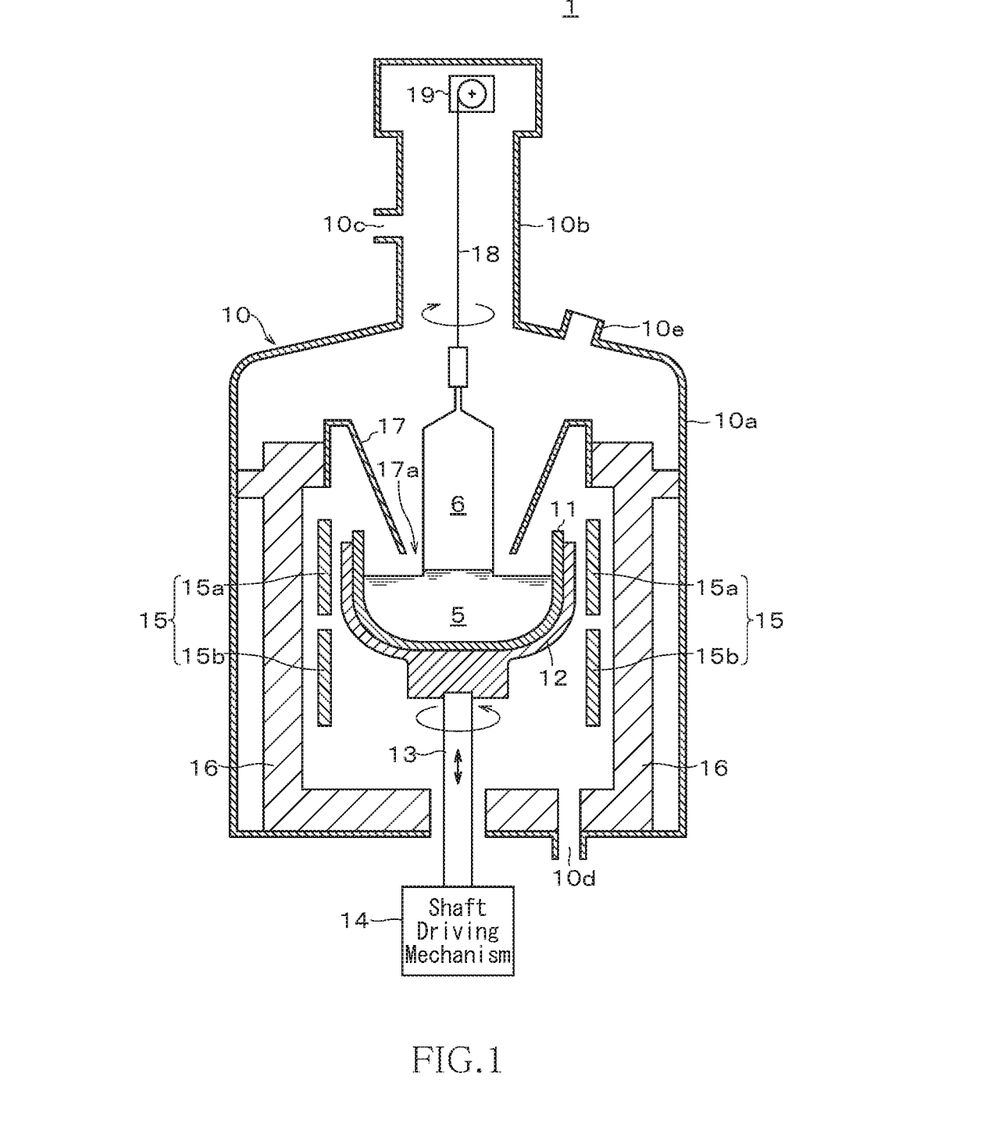
FIG. 1 is a schematic side sectional view illustrating the configuration of a single crystal manufacturing apparatus according to a first embodiment of the present invention.

FIG. 1 is a schematic side sectional view illustrating the configuration of a single crystal manufacturing apparatus according to a first embodiment of the present invention.

As illustrated in FIG. 1, a single crystal manufacturing apparatus 1 includes a chamber 10, a quartz crucible 11 set in the chamber 10, a carbon susceptor 12 that supports the quartz crucible 11, a rotary shaft 13 connected to the bottom portion of the susceptor 12, a shaft driving mechanism 14 that rotates and lifts/lowers the rotary shaft 13, a heater 15 that heats a silicon raw material in the quartz crucible 11, a heat insulation material 16 provided inside the chamber 10, a heat-shield body 17 provided above the quartz crucible 11, a single crystal pull-up wire 18 suspended above the center of the quartz crucible 11, and a wire winding mechanism 19 disposed above the chamber 10.

The chamber 10 is constituted of a main chamber 10a and an elongated cylindrical pull chamber 10b connected to an upper opening of the main chamber 10a. The quartz crucible 11 and the heater 15 are provided in the main chamber 10a. A gas inlet port 10c for introducing inert gas (purge gas) such as argon gas into the chamber 10 is formed in the pull chamber 10b, and a gas exhaust port 10d for exhausting the argon gas is formed at the lower portion of the main chamber 10a. A sight window 10e is formed at the upper portion of the main chamber 10a so as to allow a state of a silicon melt in the quartz crucible 11 to be observed.

The heater 15 is provided to melt the silicon raw material filled in the quartz crucible 11 and maintain the melt state thereof. The heater 15 is a carbon heater of a resistance heating type and is provided so as to surround the entire periphery of the quartz crucible 11. The heat insulation material 16 covers the side and bottom surfaces inside the main chamber 10a, whereby heating efficiency of the silicon material is enhanced.

The heater 15 according to the present embodiment is a division heater divided into upper and lower parts: an upper heater 15a and a lower heater 15b. The upper and lower heaters 15a and 15b can be controlled independently of each other. For example, power of the upper heater 15a can be increased or reduced as compared to that of the lower heater 15b. The upper and lower heaters 15a and 15b constitute a so-called side heater disposed so as to face the side wall portion of the quartz crucible 11.

The heat-shield body 17 is a substantially truncated cone shaped carbon member that covers the quartz crucible 11 from above, whereby temperature gradient in a pull-up axis direction around a solid/liquid interface is optimized. The heat-shield body 17 has an opening 17a having a diameter larger than the maximum diameter of a single crystal 6 to be pulled up, allowing the single crystal 6 to pass therethrough when being pulled up.

The susceptor 12, the rotary shaft 13, and the shaft driving mechanism 14 constitute a rotary lift mechanism for the quartz crucible 11. The lower end portion of the rotary shaft 13 penetrates the center of the bottom portion of the main chamber 10a and is connected to the shaft driving mechanism 14 provided outside the main chamber 10a.

The wire 18 and the wire winding mechanism 19 constitute a crystal pull-up mechanism. The wire 18 serves as a pull-up axis for pulling up the single crystal 6, and the pull-up axis coincides with the rotation center axis of the quartz crucible 11. The wire winding mechanism 19 is disposed at the upper portion of the pull chamber 10b, and the lower end of the wire 18 extends downward from the wire winding mechanism 19 to the inner space of the main chamber 10a through the pull chamber 10b. FIG. 1 illustrates a state where the single crystal 6 during growing is suspended by the wire 18.

In the manufacturing process of the silicon single crystal 6, a raw material such as polycrystalline silicon is packed into the quartz crucible 11 set in the susceptor 12, and a seed crystal is attached to the lower end of the wire 18 through a seed chuck (not illustrated). Then, the silicon raw material in the quartz crucible 11 is heated by the heater 15 to generate a melt 5. Then, the seed crystal is lowered to be dipped into the melt 5 and is then slowly lifted while rotating the seed crystal and the quartz crucible 11, whereby a substantially columnar shaped silicon single crystal 6 grows. The diameter of the silicon single crystal 6 is controlled by controlling the pull-up speed thereof and power of the heater 15.

During the manufacturing of the single crystal, the inside of the chamber 10 is maintained in a depressurized state. The chamber 10 is supplied with argon gas through the gas inlet port 10c formed above the quartz crucible 11, and the argon gas is exhausted through the gas exhaust port 10d formed below the quartz crucible 11, whereby the argon gas flows from the upper side to lower side in the chamber 10. SiO gas or CO gas generated in the chamber 10 is exhausted through the gas exhaust port 10d together with the argon gas.

Figure 2:
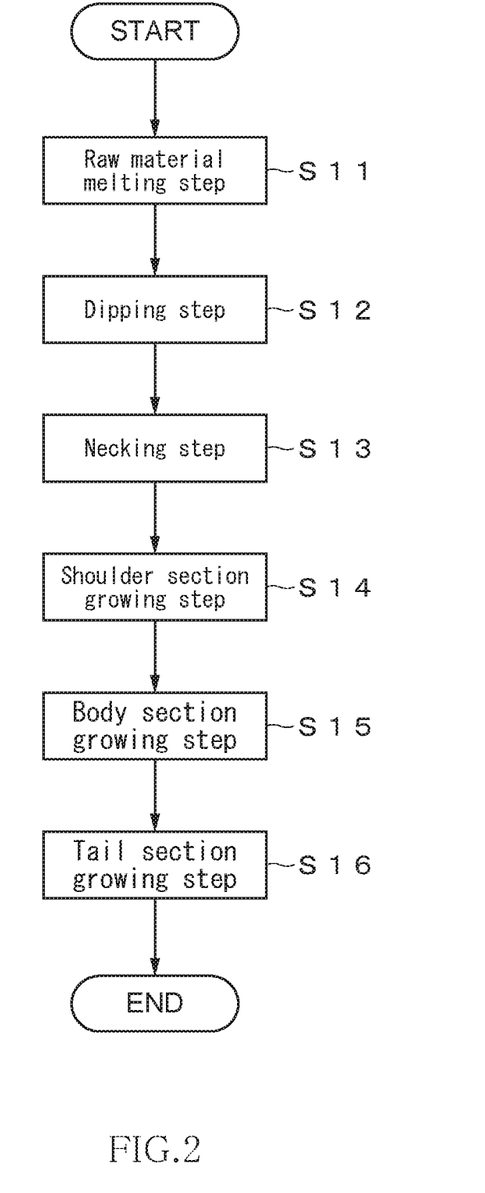
FIG. 2 is a flowchart illustrating the manufacturing process of the silicon single crystal.

FIG. 2 is a flowchart illustrating the manufacturing process of the silicon single crystal.

As illustrated in FIG. 2, in the manufacturing process of the silicon single crystal 6, the following steps are performed sequentially: a raw material melting step S11 in which the silicon raw material in the quartz crucible 11 is heated to generate the melt 5; a dipping step S12 in which the seed crystal is dipped into the melt 5; a necking step S13 in which a neck section having a reduced crystal diameter is formed; a shoulder section growing step S14 in which a shoulder section having a gradually increased crystal diameter is formed so as to obtain a single crystal having a prescribed diameter (e.g., about 300 mm); a body section growing step S15 in which a body section having a prescribed crystal diameter in the entire range thereof is formed; and a tail section growing step S16 in which the crystal is reduced in diameter at the end of pull-up and ultimately separated from the liquid surface.

Figure 3:
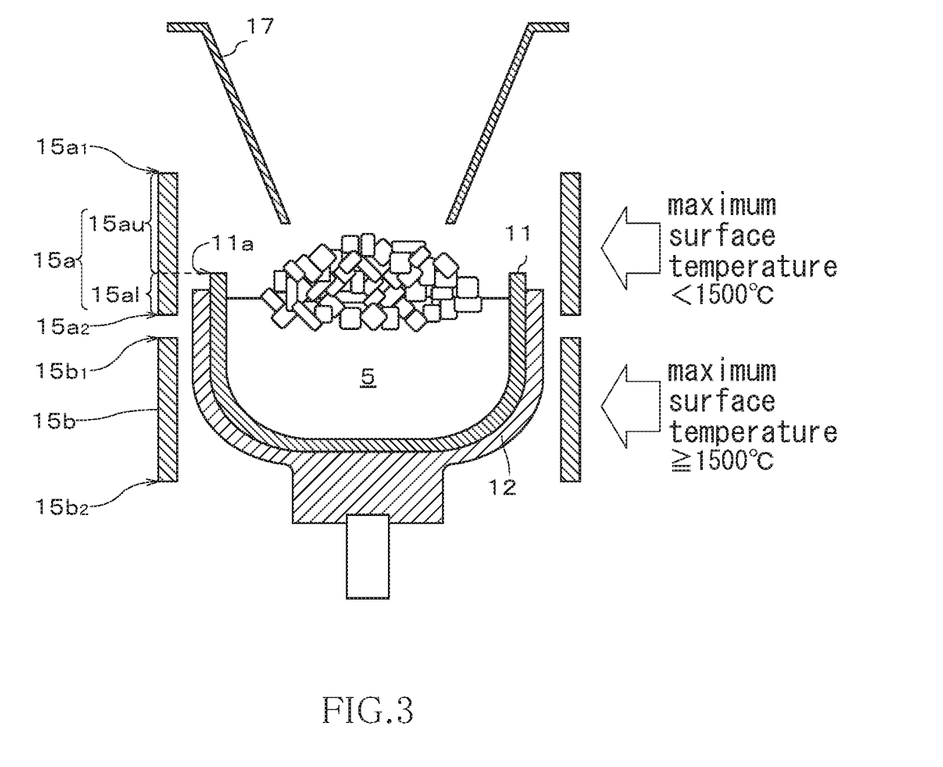
FIG. 3 is a schematic view for explaining a silicon raw material heating method performed in the raw material melting step.

FIG. 3 is a schematic view for explaining a silicon raw material heating method performed in the raw material melting step S11.

As illustrated in FIG. 3, in the raw material melting step S11 in which the silicon melt 5 is generated, the maximum surface temperature of the upper heater 15a is maintained below 1500° C., and the maximum surface temperature of the lower heater 15b is increased to 1500° C. or higher. Further, in the raw material melting step S11, the height position of the quartz crucible 11 is set such that an upper end $15a_1$ of the upper heater 15a is positioned above an upper end 11a of the quartz crucible 11 and an upper end $15b_1$ of the lower heater 15b is positioned below the upper end 11a of the quartz crucible 11. By thus setting the maximum surface temperature of the upper heater 15a below 1500° C., a reaction between the upper heater 15a and SiO gas can be suppressed to minimize generation of CO gas, thus preventing the CO gas from dissolving in the silicon raw material in the quartz crucible 11. Further, by setting the maximum surface temperature of the lower heater 15b to 1500° C. or higher, the silicon raw material in the quartz crucible 11 can be sufficiently heated for melting.

As described above, carbon contamination of the silicon single crystal 6 is derived from CO gas generated from the heater 15. That is, SiO gas evaporated from the silicon melt 5 reacts with the high-temperature heater 15 to generate CO gas, and the generated CO gas adheres to the surface of an unmelted silicon raw material. Then, carbon is dissolved in the silicon melt during the melting of the raw material, with the result that the carbon concentration in the melt is increased, which in turn increases the carbon concentration in a single crystal pulled up from the melt.

The reaction between SiO and carbon in the chamber 10 includes two reactions: one is a reaction represented by the following formula (1) in which SiC and CO gas are generated from SiO and carbon; and the other is a reaction represented by the following formula (2) in which SiC and $SiO_2$ are generated from SiO and carbon.

$$SiO+2C=SiC+CO \quad (1)$$

$$SiO+\tfrac{1}{2}C=\tfrac{1}{2}SiC+\tfrac{1}{2}SiO_2 \quad (2)$$

As described above, the CO gas is generated in the reaction represented by the formula (1) (first reaction formula), while the CO gas is not generated in the reaction represented by the formula (2) (second reaction formula). Thus, by making the latter reaction dominant over the former, an increase in the CO gas can be suppressed, thus allowing a reduction in the carbon concentration in the single crystal. Comparative merits and demerits of the two reactions can be known from their respective standard Gibbs energies, and a reaction having a lower standard Gibbs energy becomes dominant.

Figure 4:
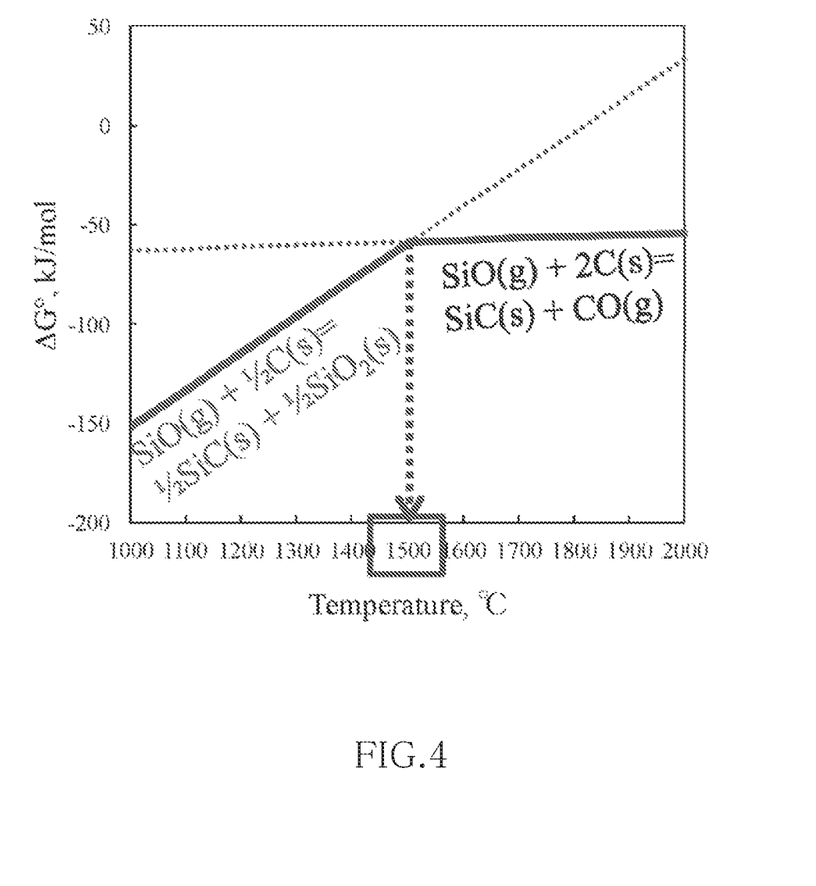
FIG. 4 is a graph illustrating temperature changes in the standard Gibbs energies in the above two reactions, wherein the horizontal axis represents temperature, and the vertical axis represents the Gibbs energy.

FIG. 4 is a graph illustrating temperature changes in the standard Gibbs energies in the above two reactions. In this graph, the horizontal axis represents temperature, and the vertical axis represents the Gibbs energy.

As illustrated in FIG. 4, both the standard Gibbs energies in the reactions represented by the formula (1) and the formula (2) linearly change with respect to a temperature change. In particular, the inclination of the graph in the reaction of the formula (1) is small, and the inclination of the graph in the reaction of the formula (2) is large. The temperature at the intersection of the two graphs is 1500° C., and the reaction of the formula (1) in which the CO gas is generated is dominant in a temperature range of 1500° C. or higher, while the reaction of the formula (2) in which the CO gas is not generated is dominant in a temperature range below 1500° C. Thus, by setting the maximum surface temperature of the heater to below 1500° C., it is possible to suppress generation of the CO gas that causes an increase in the carbon concentration, thereby making it possible to suppress an increase in the carbon concentration in the silicon single crystal.

In the raw material melting step S11, the quartz crucible 11 is preferably lowered to such a degree that the upper end 11a of the quartz crucible 11 is not positioned below the lower end $15a_2$ of the upper heater 15a (see FIG. 3). When the maximum surface temperature of the lower heater 15b is significantly increased in place of reducing the maximum surface temperature of the upper heater 15a to a low level to make heating for the lower portion of the quartz crucible 11 dominant, the temperature of the bottom portion of the crucible excessively rises to increase a heat load applied to the quartz crucible 11, accelerating roughening or erosion of the crucible surface, which may increase dislocation of the silicon single crystal. However, when the quartz crucible 11 is lowered to such a degree that the upper end 11a of the quartz crucible 11 is not positioned below the lower end $15a_2$ of the upper heater 15a, radiant heat from the upper heater 15a is directly irradiated onto the silicon raw material in the quartz crucible 11, so that heating efficiency of the silicon raw material can be enhanced. That is, it is possible to melt the silicon raw material without significantly increasing the maximum surface temperature of the lower heater 15b, thus making it possible to minimize dislocation of the single crystal while suppressing a temperature increase in the crucible bottom portion.

When the maximum surface temperature of the lower heater 15b is set to 1500° C. or higher, generation of the CO gas from the lower heater 15b is increased. However, the lower heater 15b is positioned below the upper end of the quartz crucible 11, and the argon gas flows from the upper side to the lower side in the chamber 10, so that the CO gas generated from the lower heater 15b hardly enters the quartz crucible 11 owing to influence of the flow of the argon gas. Thus, no problem occurs even when the maximum surface temperature of the lower heater 15b is set to 1500° C. or higher, and the increase in the maximum surface temperature of the lower heater 15b allows the silicon raw material to be reliably melted.

The temperature of the entire surface of the upper heater 15a may be below 1500° C., and the maximum surface temperature of an upper part 15au (see FIG. 3) of the upper heater 15a positioned above the height position of the upper end 11a of the quartz crucible 11 may be below 1500° C. When at least the maximum surface temperature of the upper part 15au of the upper heater 15a is below 1500° C., it is possible to sufficiently reduce the possibility that the CO gas generated by a reaction between the upper heater 15a and SiO gas is dissolved in the silicon raw material in the quartz crucible 11. Further, when the temperature of the entire surface of the upper heater 15a is set below 1500° C., the maximum surface temperature of the upper part 15au of the upper heater 15a is inevitably below 1500° C., and this gives rise to no inconvenience.

The minimum surface temperature of the upper heater 15a is preferably 1300° C. or higher. When the minimum surface temperature of the upper heater 15a is below 1300° C., it takes much time to melt the raw material, resulting in a reduction in productivity.

The maximum surface temperature of the lower heater 15b is preferably 1850° C. or lower, and a part (lower part 15al (second part) of the upper heater 15a) of the upper heater 15a below the upper part 15au (first part) is also preferably 1850° C. or lower. The higher the surface temperature of the heater is, the faster the raw material in the quartz crucible 11 can be melted; however, when the temperature of the quartz crucible 11 exceeds 1600° C., the quartz crucible 11 is softened and deformed. Therefore, the maximum surface temperature of the lower heater 15b and that of the lower part 15al of the upper heater 15a are preferably 1850° C. or lower.

In the present embodiment, it is important to set the maximum surface temperature of the lower heater 15b to 1500° C. or higher. This is because that it is the radiant heat from the lower heater 15b that mainly melts the raw material in the quartz crucible 11 since the maximum surface temperature of at least the upper part 15au of the upper heater 15a is set below 1500° C. and that the temperature of the silicon raw material cannot be increased to a temperature equal to or higher than its melting point (1412° C.) unless the maximum surface temperature of the lower heater 15b is set to 1500° C. or higher. In order to shorten the time required to melt the raw material to improve productivity, the temperature of the entire surface of the lower heater 15b is preferably set to 1500° C. or higher. That is, by setting the minimum surface temperature of the lower heater 15b to 1500° C., it is possible to melt the raw material in a short time while reducing the concentration of carbon taken into the single crystal even though the CO gas is generated by a reaction between the SiO gas evaporated from the silicon melt 5 and the high-temperature heater 15.

The upper heater 15a may have such a temperature distribution that the surface temperature of the lower end $15a_2$ is always higher than that of the upper end $15a_1$. When the upper heater 15a has such a temperature distribution, the heating control in the raw material melting step can be comparatively easily carried out.

Powers required for the respective upper heater 15a and lower heater 15b to obtain their predetermined surface temperatures can be calculated from a heat simulation of a single crystal manufacturing apparatus. The powers calculated from simulation results are supplied to the respective upper heater 15a and lower heater 15b, whereby the upper and lower heaters 15a and 15b can be heated at their predetermined surface temperatures.

The surface temperatures of the upper and lower heaters 15a and 15b after the end of the raw material melting step S11 (in the dipping step S12 and subsequent steps) are not particularly limited. This is because carbon in the CO gas is hardly dissolved in liquid silicon, and the carbon concentration in the silicon melt is substantially free from the influence of the CO gas. Thus, it is possible to make the maximum surface temperatures of both the upper heater 15a and the lower heater 15b equal to 1500° C. or higher. It is also possible to maintain the maximum surface temperatures of both the upper heater 15a and the lower heater 15b below 1500° C.

When carrying out the multi-pulling method in which a plurality of silicon single crystals are manufactured using a single quartz crucible through alternate repetition of the raw material melting step and a subsequent crystal pull-up step, the silicon raw material may be heated in each of the plurality of raw material melting steps with the maximum surface temperature of the upper heater 15a maintained below 1500° C. and the maximum surface temperature of the lower heater 15b increased to 1500° C. or higher. As described above, in the multi-pulling method, the problem of carbon contamination becomes prominent since the carbon concentration in the single crystal increases as the number of times of pulling up the single crystal increases. However, in the present embodiment, the maximum surface temperature of the upper heater 15a during the raw material melting step is maintained below 1500° C., thereby allowing suppression of carbon contamination. Thus, effects advantageous for the multi-pulling method can be obtained.

As described above, according to the silicon single crystal manufacturing method according to the present embodiment, in the raw material melting step S11, the maximum surface temperature of the upper heater 15a is maintained below 1500° C., while the maximum surface temperature of the lower heater 15b is increased to 1500° C. or higher, so that it is possible to suppress the generation of a large amount of CO gas due to a reaction between the upper heater 15a and SiO gas, thus making it possible to suppress an increase in carbon concentration in the silicon single crystal 6.

Figure 5:
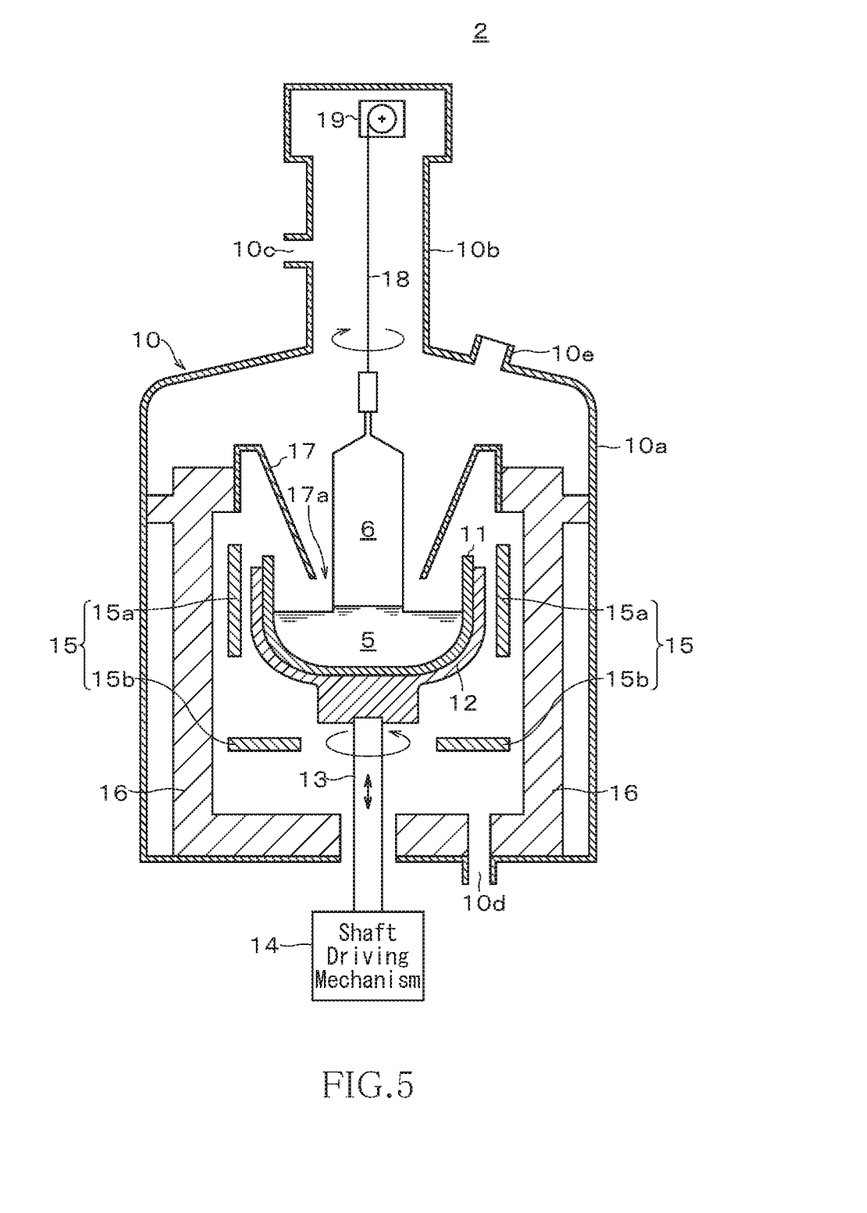
FIG. 5 is a schematic side sectional view illustrating the configuration of a single crystal manufacturing apparatus according to a second embodiment of the present invention.

FIG. 5 is a schematic side sectional view illustrating the configuration of a single crystal manufacturing apparatus according to a second embodiment of the present invention.

As illustrated in FIG. 5, a single crystal manufacturing apparatus 2 according to the present embodiment is featured in that the upper heater 15a of the heater 15 serves as a so-called side heater disposed so as to face the side wall portion of the quartz crucible 11 and that the lower heater 15b serves as a bottom heater disposed so as to face the bottom portion of the quartz crucible 11. Further, the upper heater 15a has a larger dimension in the height direction than that of the upper heater 15a illustrated in FIG. 1 and thus can heat a wider area. Other configurations are the same as those of the first embodiment.

In the present embodiment as well, during the raw material melting step S11, the maximum surface temperature of at least the upper part of the upper heater 15a is maintained below 1500° C., and the maximum surface temperature of the lower heater 15b is increased to 1500° C. or higher. Further, the melting operation of the silicon raw material is carried out with the quartz crucible 11 lowered to such a degree that the upper end 11a of the quartz crucible 11 goes below the lower end $15a_2$ of the upper heater 15a. This can suppress the generation of the CO gas due to a reaction between the upper heater 15a and SiO gas, thus making it possible to suppress an increase in carbon concentration in the silicon single crystal.

Figure 6:
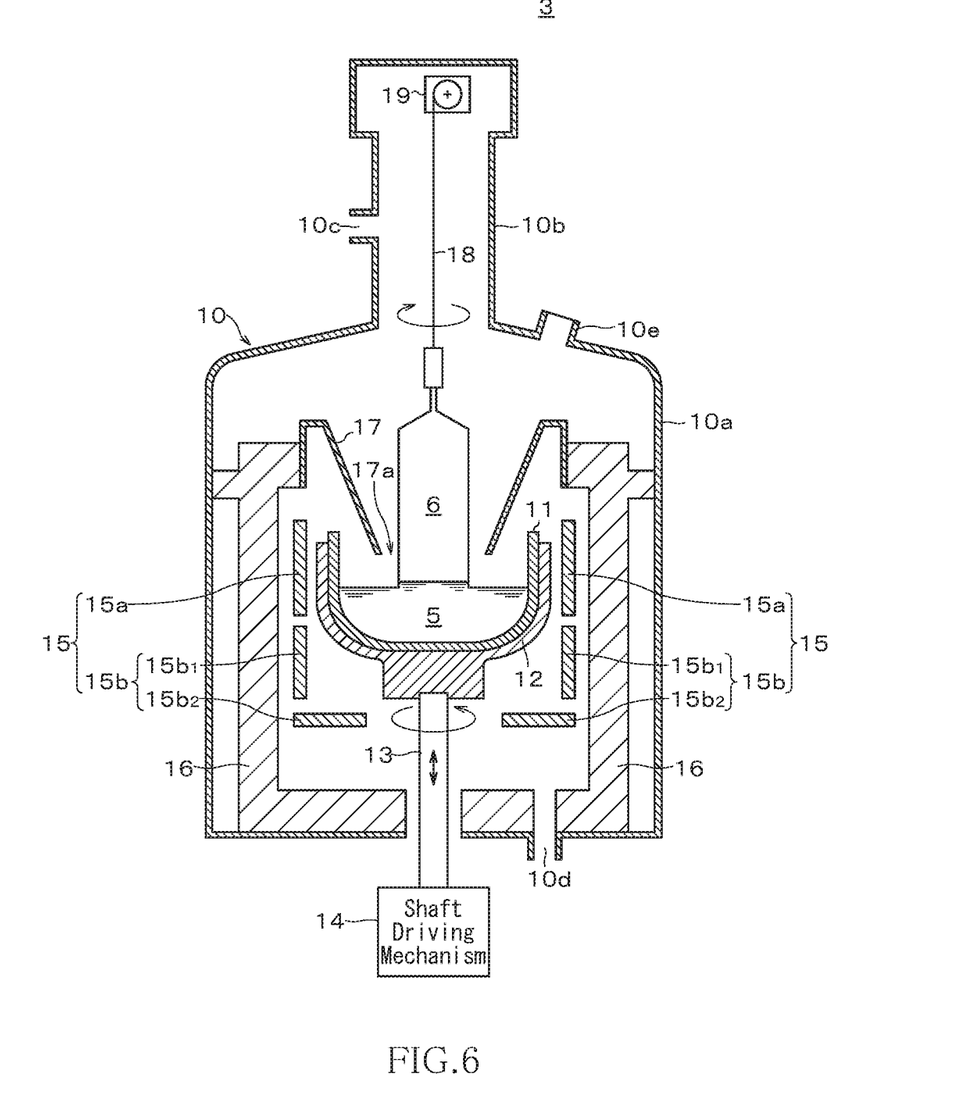
FIG. 6 is a schematic side sectional view illustrating the configuration of a single crystal manufacturing apparatus according to a third embodiment of the present invention.

FIG. 6 is a schematic side sectional view illustrating the configuration of a single crystal manufacturing apparatus according to a third embodiment of the present invention.

As illustrated in FIG. 6, a single crystal manufacturing apparatus 3 according to the present embodiment is featured in that the heater 15 is constituted of the upper heater 15a and first and second lower heaters $15b_1$ and $15b_2$ disposed below the upper heater 15a. The second lower heater $15b_2$ is disposed below the first lower heater $15b_1$. The first lower heater $15b_1$ and the second lower heater $15b_2$ serve as a side heater and a bottom heater, respectively. The second lower heater $15b_2$ may serve as a side heater.

As described above, the present invention is applicable to a raw material melting step using a multistage heater having three or more stages of heaters. In this case, the maximum surface temperature of at least a part of a heater of the uppermost stage (i.e., the upper heater) that is positioned above the upper end of the quartz crucible is maintained below 1500° C., and the maximum surface temperatures of other heaters (lower heaters) are increased to 1500° C. or higher.

Figure 7:
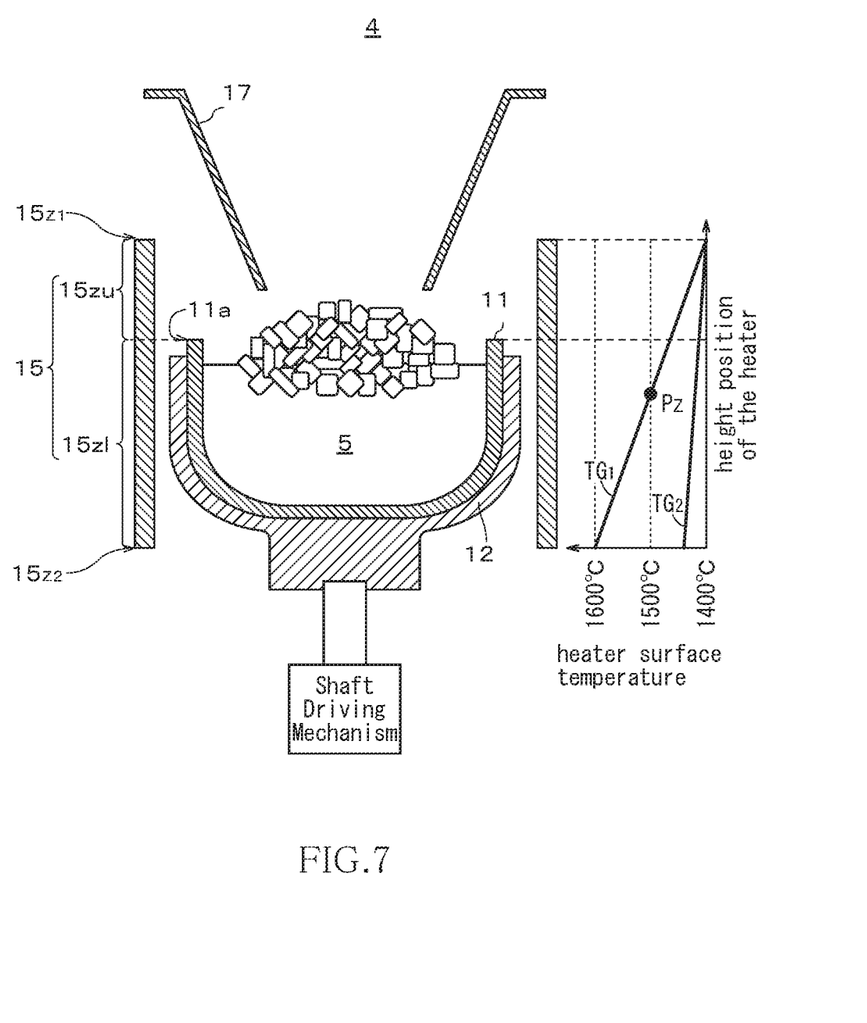
FIG. 7 is a schematic view for explaining the configuration and operation of a single crystal manufacturing apparatus according to a fourth embodiment of the present invention, and particularly for explaining a silicon raw material heating method performed using a single heater together with a temperature distribution of the heater.

FIG. 7 is a schematic view for explaining the configuration and operation of a single crystal manufacturing apparatus according to a fourth embodiment of the present invention. In particular, FIG. 7 explains a silicon raw material heating method performed using a single heater together with a temperature distribution of the heater.

As illustrated in FIG. 7, a single crystal manufacturing apparatus 4 according to the present embodiment is featured in that it uses a single heater 15 (side heater) that can produce a temperature gradient in the vertical direction. In the raw material meting step, an upper end $15z_1$ of the heater 15 is positioned above the upper end 11a of the quartz crucible 11, and a lower end $15z_2$ of the heater 15 is positioned below the upper end 11a of the quartz crucible 11. The heater 15 has a first part (upper part) 15Zu positioned above the upper end 11a of the quartz crucible 11 and a second part (lower part) 15zl positioned below the upper end 11a of the quartz crucible 11.

In the raw material melting step, the maximum surface temperature of the first part 15zu of the heater 15 is maintained below 1500° C. Further, in the raw material melting step, the maximum surface temperature of the second part 15zl of the heater 15 is preferably increased to 1500° C. or higher. Thus, for example, as represented by the graph $TG_1$, in the temperature distribution of the heater 15, the temperature of the heater 15 linearly changes from the lower end $15z_2$ toward the upper end $15z_1$ of the heater 15 in a range of, e.g., 1600° C. to 1400° C., wherein the position Pz at which the heater temperature is 1500° C. is positioned below the upper end 11a of the quartz crucible 11.

The maximum surface temperature of the second part 15zl of the heater 15 is preferably maintained at 1500° C. or higher throughout the raw material melting step. Alternatively, as represented by the graph $TG_2$, the maximum surface temperature of the second part 15zl of the heater 15 may be controlled such that it is below 1500° C. at the start of the raw material melting step, then gradually increases as the raw material melting step progresses, and reaches 1500° C. or higher (e.g., 1600° C.) in the middle or final stage of the raw material melting step as represented by the graph $TG_1$. Further, as long as the raw material can be melted, the maximum surface temperature of the second part 15zl of the heater 15 may be maintained below 1500° C. throughout the raw material melting step.

As described above, according to the silicon single crystal manufacturing method according to the present embodiment, in the raw material melting step S11 using the single heater 15, the maximum surface temperature of the first part 15zu of the heater 15 that is positioned above the upper end 11a of the quartz crucible 11 is maintained below 1500° C., so that it is possible to suppress the generation of a large amount of CO gas due to a reaction between the heater 15 and SiO gas, thus making it possible to suppress an increase in carbon concentration in the silicon single crystal 6.

While the preferred embodiments of the present invention have been explained above, the present invention is not limited thereto and may be variously modified without departing from the scope of the present invention. Accordingly, all such modifications are included in the present invention.

For example, in the above embodiments, the maximum surface temperature of the lower heater 15b is increased to 1500° C. or higher; however, the maximum surface temperature of the lower heater 15b need not necessarily be increased to 1500° C. or higher and instead, power of the lower heater 15b is made lager than that of the upper heater 15a. With this configuration, it is possible to make up for the insufficient output of the entire heater due to suppression of the maximum surface temperature of the upper heater 15a, and by enhancing heating power of the lower heater 15b, the silicon raw material can be melted.

EXAMPLE

Carbon concentrations in the silicon single crystal grown under the following surface temperature conditions 1 to 4 of the heater 15 in the raw material melting step were evaluated. The single crystal manufacturing apparatus of FIG. 1 was used to pull up the silicon single crystal. The surface temperatures of the heater under the respective conditions 1 to 4 were calculated from simulations. As illustrated in Table 1, under the condition 1, the maximum surface temperature of the upper part 15au of the upper heater 15a was 1406° C., and the surface temperature of the lower heater 15b was in a range of 1421° C. to 1445° C. Under the condition 2, the maximum surface temperature of the upper part 15au of the upper heater 15a was 1527° C., and the surface temperature of the lower heater 15b was in a range of 1537° C. to 1549° C. Under the condition 3, the maximum surface temperature of the upper part 15au of the upper heater 15a was 1482° C., and the surface temperature of the lower heater 15b was in a range of 1507° C. to 1590° C. Under the condition 4, the maximum surface temperature of the upper part 15au of the upper heater 15a was 1464° C., and the surface temperature of the lower heater 15b was in a range of 1489° C. to 1573° C.

Then, a silicon single crystal ingot having a diameter of about 300 mm was pulled up from a silicon melt generated in the raw material melting step by CZ method, and the carbon concentration at the lowermost end portion of the silicon single crystal ingot was measured by FT-IR method. The reason that the measurement of the carbon concentration at the lowermost end portion of the silicon single crystal ingot is performed is that the carbon concentration in the silicon single crystal ingot is highest at the lowermost end in the pull-up axis direction due to segregation to make it most convenient for the carbon concentration to be evaluated.

As illustrated in Table 1, under the condition 1 (comparative example 1), not only the surface temperature of the upper heater 15a, but also the surface temperature of the lower heater 15b was as low as below 1500° C., so that the raw material was not melted, resulting in failing to grow the silicon single crystal. Under the condition 2 (comparative example 2), the maximum surface temperature of the upper part 15au of the upper heater 15a was high, with the result that the carbon concentration in the silicon single crystal was relatively increased.

Under the condition 3 (first example), the maximum surface temperature of the upper part 15au of the upper heater 15a was below 1500° C., and the lowest surface temperature of the lower heater 15b was 1500° C. or higher, so that the carbon concentration in the silicon single crystal can be relatively reduced, and the relative value of the carbon concentration to the condition 2 was 91.

Under the condition 4 (second example), while the maximum surface temperature of the upper part 15au of the upper heater 15a was below 1500° C. as under the condition 3, the lowest surface temperature of the lower heater 15b was below 1500° C. However, the maximum surface temperature of the lower heater 15b was 1573° C. (i.e., 1500° C. or higher), so that the raw material was melted to allow the silicon single crystal to be grown. The carbon concentration in the silicon single crystal was further reduced as compared to the condition 3, and the relative value of the carbon concentration to the condition 2 was 84.

TABLE 1

| | Maximum surface temperature of upper part of upper heater | Surface temperature of lower heater | Carbon concentration (relative value to comparative example 2) |
|---|---|---|---|
| Condition 1 (comparative example 1) | 1406° C. | 1421° C. to 1445° C. (maximum temperature: 1445° C.) | Raw material is not melted |
| Condition 2 (comparative example 2) | 1527° C. | 1537° C. to 1549° C. (maximum temperature: 1549° C.) | 100 |
| Condition 3 (example 1) | 1482° C. | 1507° C. to 1590° C. (maximum temperature: 1590° C.) | 91 |
| Condition 4 (example 2) | 1464° C. | 1489° C. to 1573° C. (maximum temperature: 1573° C.) | 84 |

The above results reveal that the carbon concentration in the silicon single crystal obtained when the maximum surface temperatures of the upper part 15*au* of the upper heater 15 and of the lower heater 15*b* thereof are set to below 1500° C. and 1500° C. or higher, respectively, in the raw material melting step becomes lower than that obtained when the maximum surface temperature of the upper part 15*au* of the upper heater 15*a* is set to 1500° C. or higher.

REFERENCE SIGNS LIST 1,2,3,4 single crystal manufacturing apparatus
5 silicon melt
6 silicon single crystal
10 chamber
10*a* main chamber
10*b* pull chamber
10*c* gas inlet port
10*d* gas exhaust port
10*e* sight window
11 quartz crucible
11*a* upper end of the quartz crucible
12 susceptor
13 rotary shaft
14 shaft driving mechanism
15 heater (carbon heater)
15*a* upper heater
15*au* upper part of the upper heater
15*al* lower part of the upper heater
15$a_1$ upper end of the upper heater
15$a_2$ lower end of the upper heater
15*b* lower heater
15$b_1$ upper end of the lower heater
15$b_2$ lower end of the lower heater
15$z_1$ upper end of the heater
15$z_2$ lower end of the heater
15*zu* first part (upper part) of the heater
15*zl* second part (lower part) of the heater
16 heat insulation material
17 heat-shield body
17*a* opening of the heat-shield body
18 pull-up wire
19 wire winding mechanism

What is claimed is:

1. A method of manufacturing a single crystal comprising:
heating a silicon raw material in a quartz crucible using a carbon heater to generate a silicon melt; and
pulling up a single crystal from the silicon melt generated by the heating of the silicon raw material, wherein
the silicon raw material is heated with the maximum surface temperature of a first part of the carbon heater that is positioned above at least the upper end of the quartz crucible maintained below 1500° C. in the heating of the silicon raw material; and
wherein the silicon raw material is heated with the maximum surface temperature of a second part of the carbon heater that is discontiguous with the first part and that is positioned below the upper end of the quartz crucible increased to 1500° C. or higher in the heating of the silicon raw material.

2. The method of manufacturing a single crystal as claimed in claim 1, wherein
the carbon heater includes an upper heater and a lower heater that are discontiguous with respect to one another and dividedly arranged in the vertical direction,
the upper heater includes the first part, and
the lower heater includes the second part.

3. The method of manufacturing a single crystal as claimed in claim 2, wherein the upper end of the quartz crucible is disposed between the upper and lower ends of the upper heater so as to be closer to the lower end than to the upper end in the heating of the silicon raw material.

4. The method of manufacturing a single crystal as claimed in claim 1, wherein inert gas is introduced into a chamber housing the quartz crucible and the carbon heater from above the quartz crucible and the inert gas in the chamber is exhaust from below the quartz crucible in the heating of the silicon raw material.

5. The method of manufacturing a silicon single crystal as claimed in claim 1 by using a multi-pulling method in which a plurality of silicon single crystals are manufactured using a single quartz crucible through alternate repetition of the heating of the silicon raw material and the pulling up of the single crystal, wherein
the silicon raw material is heated in each instance of the heating of the silicon raw material with the maximum surface temperature of the first part of the carbon heater maintained below 1500° C.

6. The method of claim 2, wherein the upper heater and the lower heater are independently controllable.

7. The method of claim 1, wherein the first part and the second part are independently controllable.

* * * * *